(12) United States Patent
Chu et al.

(10) Patent No.: US 8,305,758 B2
(45) Date of Patent: Nov. 6, 2012

(54) HEAT-DISSIPATING MODULE

(75) Inventors: Tse-An Chu, Taipei (TW); Chang-Yuan Wu, Taipei (TW)

(73) Assignee: Compal Electronics, Inc., Taipei (TW)

(*) Notice: Subject to any disclaimer, the term of this patent is extended or adjusted under 35 U.S.C. 154(b) by 166 days.

(21) Appl. No.: 12/861,805

(22) Filed: Aug. 23, 2010

(65) Prior Publication Data

US 2011/0043998 A1 Feb. 24, 2011

Related U.S. Application Data

(60) Provisional application No. 61/236,519, filed on Aug. 24, 2009.

(51) Int. Cl.
*H05K 7/20* (2006.01)
(52) U.S. Cl. .......... 361/700; 361/695; 361/697
(58) Field of Classification Search .......... 361/695, 361/697, 700, 703
See application file for complete search history.

(56) References Cited

U.S. PATENT DOCUMENTS

| | | | | |
|---|---|---|---|---|
| 5,042,257 | A * | 8/1991 | Kendrick et al. | 62/3.1 |
| 5,912,802 | A * | 6/1999 | Nelson | 361/695 |
| 6,009,938 | A * | 1/2000 | Smith et al. | 165/185 |
| 6,963,131 | B2 * | 11/2005 | Frisch et al. | 257/712 |
| 7,883,502 | B2 * | 2/2011 | Powers et al. | 604/523 |
| 7,903,402 | B2 * | 3/2011 | Tomioka et al. | 361/679.47 |
| 2006/0254750 | A1 * | 11/2006 | Miyazawa et al. | 165/80.3 |
| 2007/0274038 | A1 * | 11/2007 | Sun | 361/695 |
| 2007/0285890 | A1 * | 12/2007 | Tsao et al. | 361/697 |

\* cited by examiner

*Primary Examiner* — Gregory Thompson
(74) *Attorney, Agent, or Firm* — Jianq Chyun IP Office

(57) ABSTRACT

A heat-dissipating module is disclosed, which is suitable for an electronic apparatus with a case and a heat source. The heat-dissipating module includes a set of dissipation fins and a fan. The set of dissipation fins is suitable to connect a heat source and there is a flow channel between the set of dissipation fins and the case. The fan is for producing an airflow flowing towards the set of dissipation fins, while the partial airflow flows through the flow channel.

10 Claims, 4 Drawing Sheets

HEAT-DISSIPATING MODULE

CROSS-REFERENCE TO RELATED APPLICATION

This application claims the priority benefit of U.S.A. provisional application Ser. No. 61/236,519, filed on Aug. 24, 2009. The entirety of each of the above-mentioned patent applications is hereby incorporated by reference herein and made a part of specification.

BACKGROUND OF THE INVENTION

1. Field of the Invention

The present invention generally relates to a heat-dissipating module, and more particularly, to a heat-dissipating module with heat-isolating function.

2. Description of Related Art

Recently, along with the progresses of science and technology, the operation speed of a computer gets steadily advanced, which brings the electronic components inside a computer with higher and higher heat power. In order to prevent the electronic components inside the computer from being overheated to cause malfunction of the electronic components, the electronic components inside the computer must possess successive heat-dissipating effect.

Usually, a heat-sink module is composed of a fan, a set of dissipation fins and a heat pipe, wherein the set of dissipation fins is disposed at an airflow outlet of the fan and contacted the heat pipe for dissipating the heat absorbed by the heat pipe from a heat source. The set of dissipation fins comprises a plurality of parallel metal sheets, wherein any two adjacent metal sheets has a gap therebetween so as to dissipate the heat into the surrounding air. During the operation of the fan, a cooling airflow flows towards the set of dissipation fins from the airflow outlet and flows through the gaps between metal sheets where the heat is discharged out of the computer body by means of convection action so as to low down the temperature in the electronic apparatus.

However, at the time, the air discharged out of electronic apparatus has absorbed the heat of the set of dissipation fins already so that the temperature thereof is higher and, in turn, the temperature on the casing body surface of the electronic apparatus gets higher as well, which makes the user uncomfortable when touching, the casing, body surface.

SUMMARY OF THE INVENTION

Accordingly, the present invention is directed to a heat-dissipating module with a heat-isolating function on the case of an electronic apparatus.

An embodiment of the present invention provides a heat-dissipating module suitable for an electronic apparatus. The electronic apparatus herein includes a case and a heat source. The heat-dissipating module includes a set of dissipation fins and a fan, wherein the set of dissipation fins is suitable for being connected to a heat source and there is a flow channel between the set of dissipation fins and the case; the fan is for producing an airflow flowing towards the set of dissipation fins, while the partial airflow flows through the flow channel.

Based on the depiction above, in the embodiment of the present invention, by means of forming a flow channel between the dissipation fins and the case, the heat at the dissipation fins of the heat-dissipating module is isolated by a cool airflow in the flow channel, which can effectively avoid the uncomfortable influence of the heat on the user when the heat has been transmitted to the case already.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
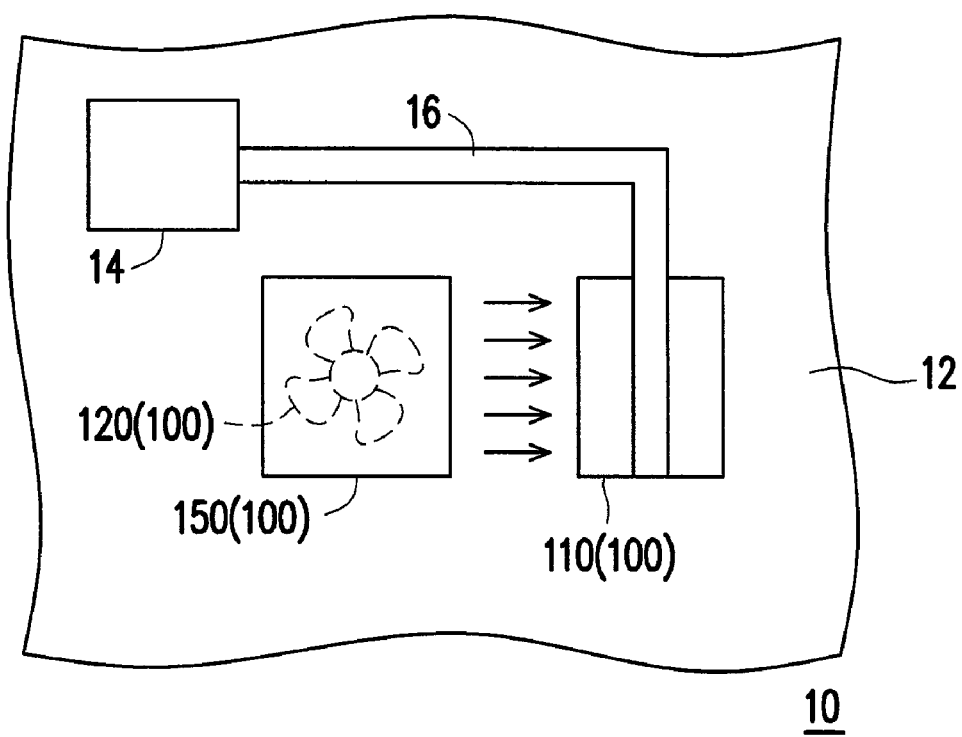
FIG. 1A is a top view of a portion of a heat-dissipating module according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
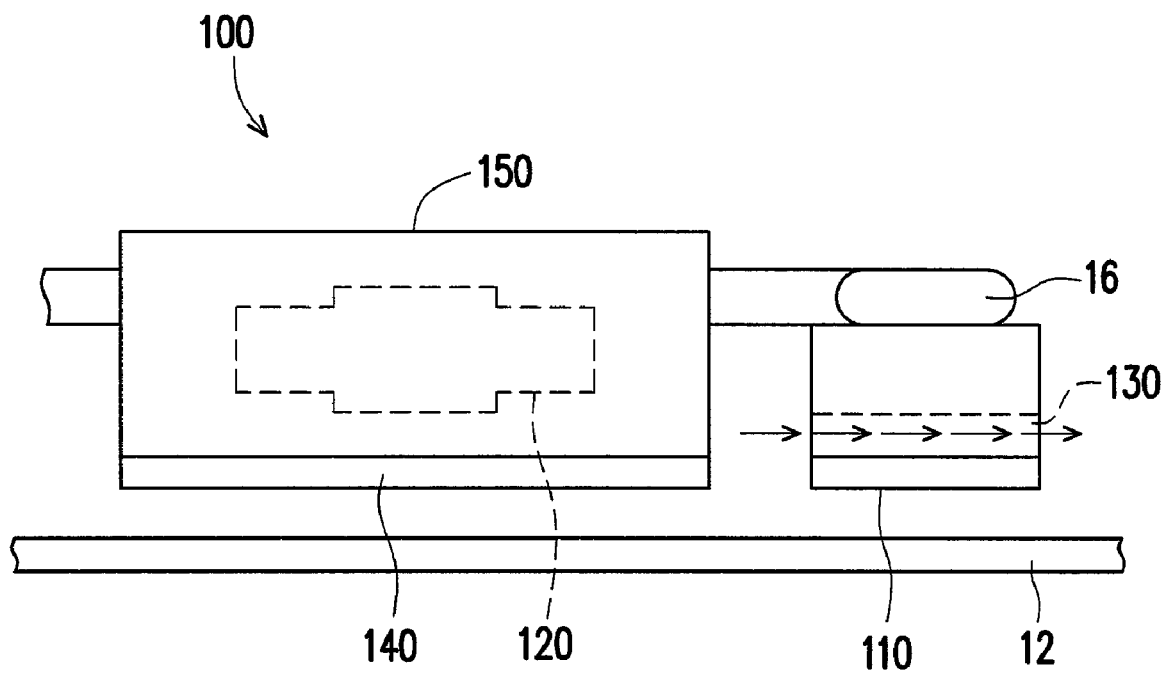
FIG. 1B is a side view of the heat-dissipating module of FIG. 1.
Figure 2:
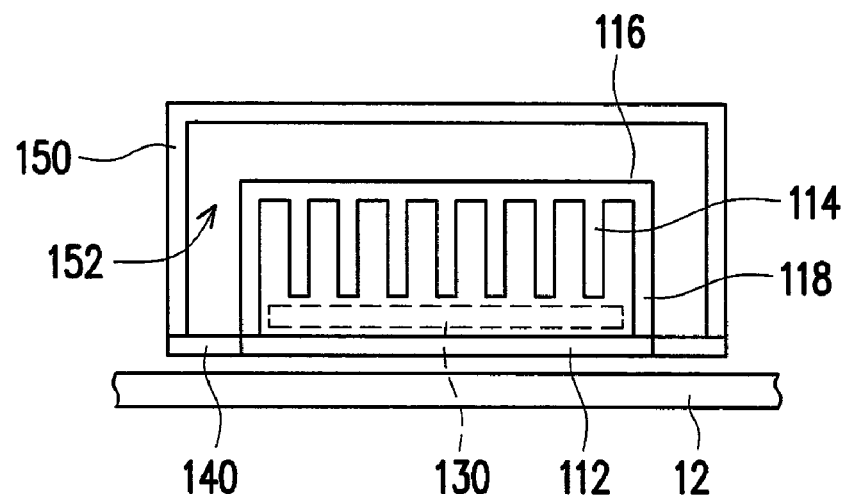
FIG. 2 is a diagram of the set of dissipation fins in the heat-dissipating module of FIG. 1B.

FIG. 1A is a top view of a portion of a heat-dissipating module according to an embodiment of the present invention, FIG. 1B is a side view of the heat-dissipating module of FIG. 1, and FIG. 2 is a diagram of the set of dissipation fins in the heat-dissipating module of FIG. 1B. Referring to FIGS. 1A to 2, in the embodiment, the heat-dissipating module 100 is suitable to be disposed in an electronic apparatus 10, for example, a notebook. The electronic apparatus 10 includes a case 12 and a heat source 14, wherein the heat source 14 is, for example, an electronic component such as CPU, graphic chip or north-bridge chip. The heat-dissipating module 100 connects the heat source 14 through a heat pipe 16 for radiating the heat produced by the heat source 14. The heat-dissipating module 100 includes a set of dissipation fins 110 and a fan 120, wherein there is a first flow channel 130 between the set of dissipation fins 110 and the case 12. The fan 120 produces an airflow flowing towards the set of dissipation fins 110. The arrow in FIG. 1B indicates the path of a part of the airflow flowing through the first flow channel 130.

It should be noted that, in the embodiment, the set of dissipation fins 110 includes a first base 112, a plurality of fins 114, a second base 116 and a connection portion 118, wherein the first base 112 and the second base 116 are connected together by means of the connection portion 118, and the fins 114 are disposed at the second base 116 and located between the first base 112 and the second base 116. The first base 112 is located between the fins 114 and the case 12 and the first flow channel 130 is located between the first base 112 and the fins 114. In another embodiment, the second base 116 of the set of dissipation fins 110 may be constructed by the junction of the fins engaged with each other, and the first base 112 may be omitted.

In the present embodiment, the fins includes longer fins, i.e. the connection portions 118 of the embodiment, and shorter fins, i.e. the fins 114 of the embodiment. The ends of longer fins are used to fix the set of dissipation fins 110 on the case 12 (or substrate) and located at both sides of the set of dissipation fins 110. The shorter fins are located between two of the longer fins, and the first flow channel 130 is included between the ends of the shorter fins and the case 12. The heat-dissipating module 100 further includes a cover 140 and a casing body 150, wherein the casing body 150 is assembled to the cover 140, while the fan 120 is disposed in the casing body 150 so that the airflow produced by the fan 120 is guided by the casing body 150 to the set of dissipation fins 110. In this way, a part of the airflow flows through between the fins 114, while the other part of the airflow flows through the first flow channel 130 so as to produce a cool airflow between the set of dissipation fins 110 and the case 12.

In short, in the embodiment, the airflow produced by the fan 120 functions not only for performing heat exchange on the set of dissipation fins 110, but also reduce the path, the heat being transferred from the set of dissipation fins 110 to the case 12 therethrough, by the flowing of the partial airflow in the first flow channel 130. In this way, it is avoided the case 12 close to the set of dissipation fins 110 gets an excessive high temperature so as to cause uncomfortable feeling with the user.

Figure 3:
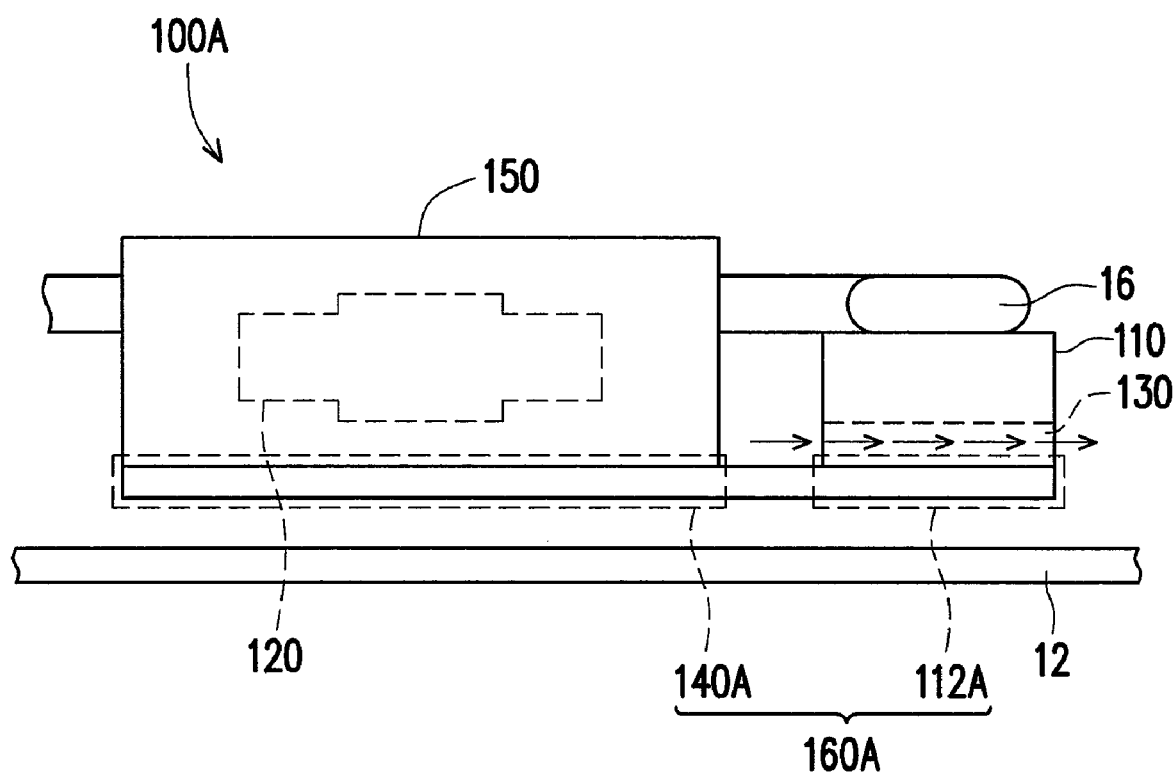
FIG. 3 is a diagram of a heat-dissipating module according to another embodiment of the present invention.

FIG. 3 is a diagram of a heat-dissipating module according to another embodiment of the present invention. Referring to FIG. 3, in the heat-dissipating module 100A of the embodiment, the first base 112A and the cover 140A are integrated into a supporting part 160A, which facilitates assembling the fan 120 and the set of dissipation fins 110 together. In another embodiment not shown, the first base 112A may be combined with a portion of the case 12 to be a supporting part 160A, or integrated with the case 12, while the cover 140 is located at a junction of the casing body 150 and the first base 112A, the first base 112A is not limited to attached to the case 12 after being integrated with the case 12, and the first base 112A is not limited to be combined with the cover 140.

Figure 4:
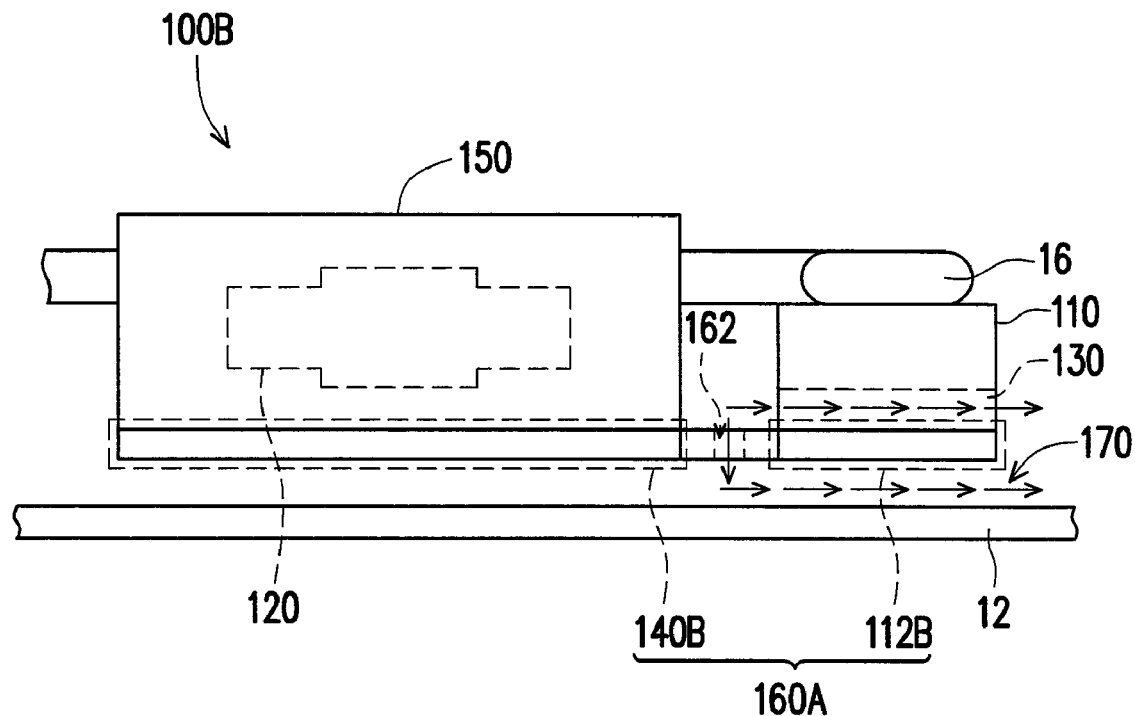
FIG. 4 is a diagram of a heat-dissipating module according to yet another embodiment of the present invention.
Figure 5:
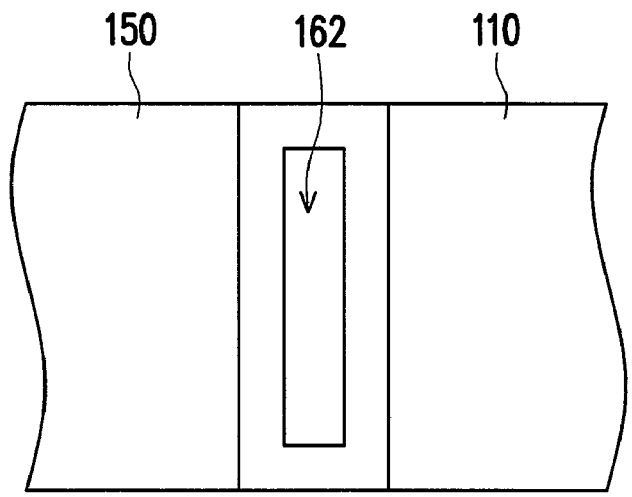
FIG. 5 is a top view of a portion of the heat-dissipating module of FIG. 4.

FIG. 4 is a diagram of a heat-dissipating module according to yet another embodiment of the present invention and FIG. 5 is a localized top view diagram of the heat-dissipating module of FIG. 4. Referring to FIGS. 4 and 5, in the heat-dissipating module 100B of the embodiment, the supporting part 160A has a gap 162 located between the first base 112B and the cover 140B. There is a second flow channel 170 between the first base 112B and the case 12, so that the partial airflow of the fan 120 guided by the casing body 150 flows along the gap 162 and the second flow channel 170. In this way, the cool airflow between the heat-dissipating module 100B and the case 12 is enhanced so as to better reach the effect of isolating the heat from being transferred to the case 12.

On the other hand, referring to FIG. 2 again, in the embodiment, the casing body 150 has an airflow outlet 152 for transferring the airflow to the set of dissipation fins 110. It should be noted that the orthogonal projection area of the set of dissipation fins 110 at the airflow outlet 152 is less than the area of the airflow outlet 152. In other words, in addition that the airflow flows through the inner side of the set of dissipation fins 110, the airflow at the airflow outlet 152 further flows through the outer side of the set of dissipation fins 110, i.e., the set of dissipation fins 110 is surrounded by the cool airflow so that the heat exchange is localized in the set of dissipation fins 110 by the surrounding cool airflow.

Figure 6:
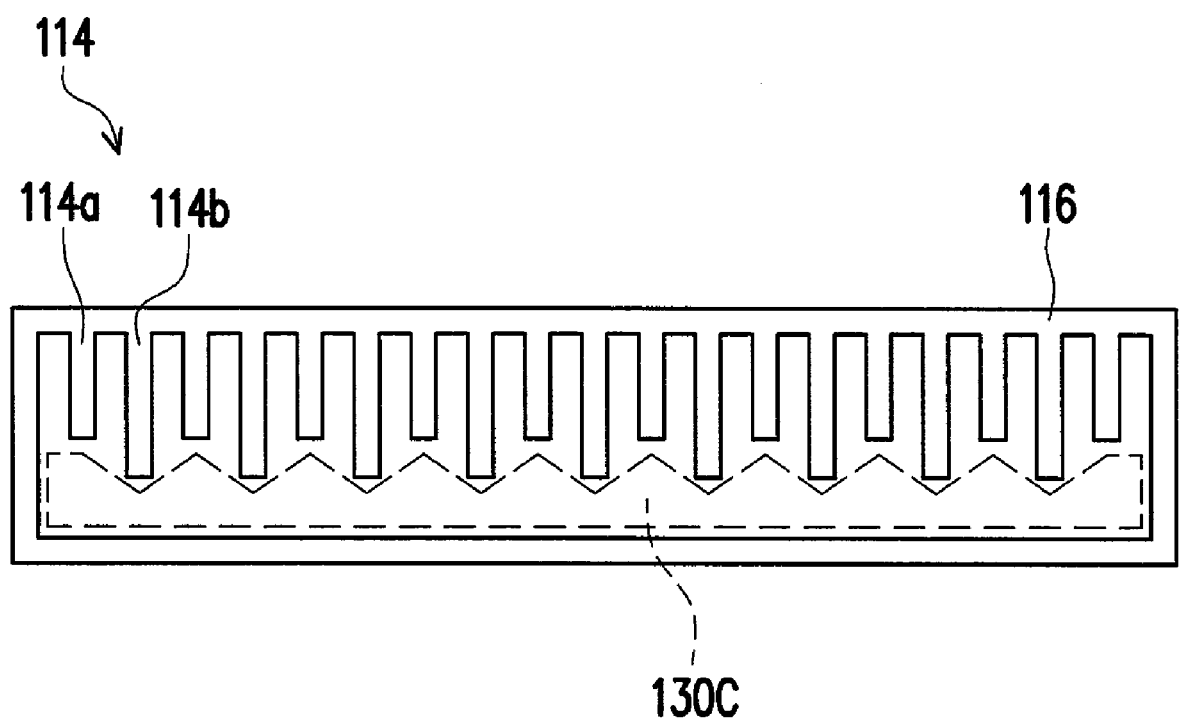
FIG. 6 is a diagram of the set of dissipation fins in a heat-dissipating module according to another embodiment of the present invention.

FIG. 6 is a diagram of the set of dissipation fins in a heat-dissipating module according to another embodiment of the present invention. Referring to FIG. 6, in the embodiment, the fins 114 include a plurality of first fins 114a and a plurality of second fins 114b, wherein the first fins 114a and the second fins 114b are interlaced by each other and vertically disposed on the second base 116. The top of each of the first fins 114a has a distance relatively to the second base 116 less than the distance between the top of each of the second fins 114b and the second base 116. In another embodiment, the first base and the second base may be formed by a plurality of first fins 114a and a plurality of second fins 114b, but the scope of the invention is not restricted herein. Therefore, the first flow channel 130C has a wave-like shape, which increases the isolation width of the first flow channel 130C to isolate the heat at the fins 114 from entering the case 12 (shown in FIG. 2).

In summary, in the above-mentioned embodiments, the present invention takes the scheme that by forming flow channels between the dissipation fins and the case, the partial airflow produced by the fan flows through the flow channels. In this way, a cool airflow is formed between the dissipation fins and the case so as to isolate the heat at the dissipation fins from the case, which can effectively avoid uncomfortable influence on the user due to transferring the heat to the case.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. A heat-dissipating module, suitable for an electronic apparatus, wherein the electronic apparatus comprises a case and a heat source; the heat-dissipating module comprising:
   a set of dissipation fins, suitable to be connected to the heat source by a heat pipe, wherein there is a first flow channel between the set of dissipation fins and the case; and
   a fan, for producing an airflow flowing towards the set of dissipation fins, wherein a part of the airflow flows through the first flow channel to exhaust from the electronic apparatus and cool the case.

2. The heat-dissipating module as claimed in claim 1, wherein the set of dissipation fins comprises:
   a first base; and
   a plurality of fins, on the first base, wherein the first base is located between the fins and the case and the first flow channel is located between the first base and the plurality of fins.

3. The heat-dissipating module as claimed in claim 2, wherein the first base is a part of the plurality of fins.

4. The heat-dissipating module as claimed in claim 2, further comprising:
   a cover; and
   a casing body, assembled at the cover, wherein the fan is disposed in the casing body.

5. The heat-dissipating module as claimed in claim 4, wherein there is a gap between the first base and the cover, there is a second flow channel between the first base and the case, and the partial airflow flows through the gap and the second flow channel.

6. The heat-dissipating module as claimed in claim 4, wherein the casing body has an airflow outlet, and the orthogonal projection area of the set of dissipation fins at the airflow outlet is less than the area of the airflow outlet so that the partial airflow flows through the outer side of the set of dissipation fins.

7. The heat-dissipating module as claimed in claim 4, wherein the cover and the first base are integrated formed.

8. The heat-dissipating module as claimed in claim 2, wherein the set of dissipation fins further comprises:
   a second base, wherein the plurality of fins are assembled to the second base; and
   a connection portion for connecting the first base and the second base together.

9. The heat-dissipating module as claimed in claim 8, wherein the second base is a part of the plurality of fins.

10. The heat-dissipating module as claimed in claim 8, wherein the plurality of fins comprise:
   a plurality of first fins; and
   a plurality of second fins, wherein the second fins and the first fins are interlaced by each other and vertically disposed on the second base and connected onto the first base, and the distance between the top of each of the first fins and the second base is less than the distance between the top of each of the second fins and the second base.

* * * * *